US009831000B2

(12) United States Patent
Hakhumyan et al.

(10) Patent No.: US 9,831,000 B2
(45) Date of Patent: Nov. 28, 2017

(54) TESTING ELECTRONIC MEMORIES BASED ON FAULT AND TEST ALGORITHM PERIODICITY

(71) Applicant: Synopsys, Inc., Mountain View, CA (US)

(72) Inventors: Aram Hakhumyan, Yerevan (AM); Gurgen Harutyunyan, Abovyan (AM); Samvel Shoukourian, Yerevan (AM); Valery Vardanian, Yerevan (AM); Yervant Zorian, Santa Clara, CA (US)

(73) Assignee: SYNOPSYS, INC., Mountain View, CA (US)

( * ) Notice: Subject to any disclaimer, the term of this patent is extended or adjusted under 35 U.S.C. 154(b) by 22 days.

(21) Appl. No.: 14/484,736

(22) Filed: Sep. 12, 2014

(65) Prior Publication Data

US 2014/0380107 A1   Dec. 25, 2014

Related U.S. Application Data

(63) Continuation of application No. 13/183,468, filed on Jul. 15, 2011, now abandoned.

(51) Int. Cl.
*G06F 11/27* (2006.01)
*G11C 29/18* (2006.01)
(Continued)

(52) U.S. Cl.
CPC ............ *G11C 29/18* (2013.01); *G06F 11/27* (2013.01); *G11C 29/10* (2013.01); *G11C 29/16* (2013.01);
(Continued)

(58) Field of Classification Search
CPC .......... G01R 31/3187; G01R 31/31724; G11C 2029/0401; G11C 2029/3602;
(Continued)

(56) References Cited

U.S. PATENT DOCUMENTS 5,471,482 A   11/1995   Byers et al.
5,640,509 A   6/1997   Balmer et al.
(Continued)

OTHER PUBLICATIONS

S. Boutobza, M. Nicolaidis, K.M. Lamara, A. Costa, "Programmable Memory BIST", In Proc. of IEEE International Test Conference, 2005, pp. 1155-1164.
(Continued)

*Primary Examiner* — Phung M Chung
(74) *Attorney, Agent, or Firm* — Alston & Bird LLP

(57) ABSTRACT

An integrated circuit includes a memory and a memory test circuit, which when invoked to test the memory, is configured to generate one or more March tests applied to the memory. The memory test circuit is further configured to construct a table including a first index, a second index, and a first March test of the one or more March tests. The first index is associated with one or more families each characterized by a different length of the one or more March tests. The second index is associated with one or more mechanisms each characterized by a different property of the one or more March tests. The memory test circuit is further configured to generate a second March test from the first March test.

21 Claims, 11 Drawing Sheets

(51) Int. Cl.
*G11C 29/10* (2006.01)
*G11C 29/16* (2006.01)
*G11C 29/36* (2006.01)
G11C 29/04 (2006.01)

(52) U.S. Cl.
CPC ...... *G11C 29/36* (2013.01); *G11C 2029/0405* (2013.01)

(58) Field of Classification Search
CPC ......... G11C 29/10; G11C 29/16; G11C 29/12; G11C 29/72; G11C 29/18; G11C 29/36; G11C 2029/0405; G06F 11/27
USPC ....... 714/718, 720, 733, 734, 738, 741, 742; 365/200, 201; 716/106
See application file for complete search history.

(56) References Cited

U.S. PATENT DOCUMENTS

| | | | |
|---|---|---|---|
| 5,673,271 A | 9/1997 | Ohsawa | |
| 6,067,262 A * | 5/2000 | Irrinki | G11C 29/006 365/200 |
| 6,367,042 B1 * | 4/2002 | Phan | G01R 31/3187 714/733 |
| 6,415,403 B1 | 7/2002 | Huang et al. | |
| 6,769,081 B1 | 7/2004 | Parulkar | |
| 7,178,076 B1 | 2/2007 | Zarrineh et al. | |
| 7,293,199 B1 | 11/2007 | Zarrineh et al. | |
| 7,428,680 B2 * | 9/2008 | Mukherjee | G01R 31/31724 714/718 |
| 7,434,131 B2 * | 10/2008 | Mukherjee | G01R 31/31724 714/718 |
| 7,490,279 B1 * | 2/2009 | Kumar | G11C 29/14 714/719 |
| 2002/0194558 A1 | 12/2002 | Wang et al. | |
| 2011/0055646 A1 * | 3/2011 | Mukherjee | G11C 29/40 714/719 |
| 2013/0019130 A1 | 1/2013 | Hakhumyan et al. | |

OTHER PUBLICATIONS

X. Du, N. Mukherjee, W.-T. Cheng, S. M. Reddy, "Full-Speed Field Programmable Memory BIST Supporting Multi-level Looping", IEEE International Workshop on Memory Technology, Design, and Testing, 2005, pp. 67-71.

W. L. Wang, K. J. Lee, J. F. Wang, "An On-Chip March Pattern Generator for Testing Embedded Memory Cores", IEEE Transactions on VLSI systems, 9 (5), Oct. 2001, pp. 730-735.

K. Zarrineh and S. J. Upadhyaya, "On Programmable Memory Built-In Self Test Architectures," In Proc. of IEEE Conference on Design, Automation and Test in Europe, 1999, pp. 708-713.

Non-Final Office Action dated Dec. 12, 2013 for U.S. Appl. No. 13/183,468, 9 pages.

Notice of Allowance dated Jun. 13, 2014 for U.S. Appl. No. 13/183,468, 8 pages.

* cited by examiner

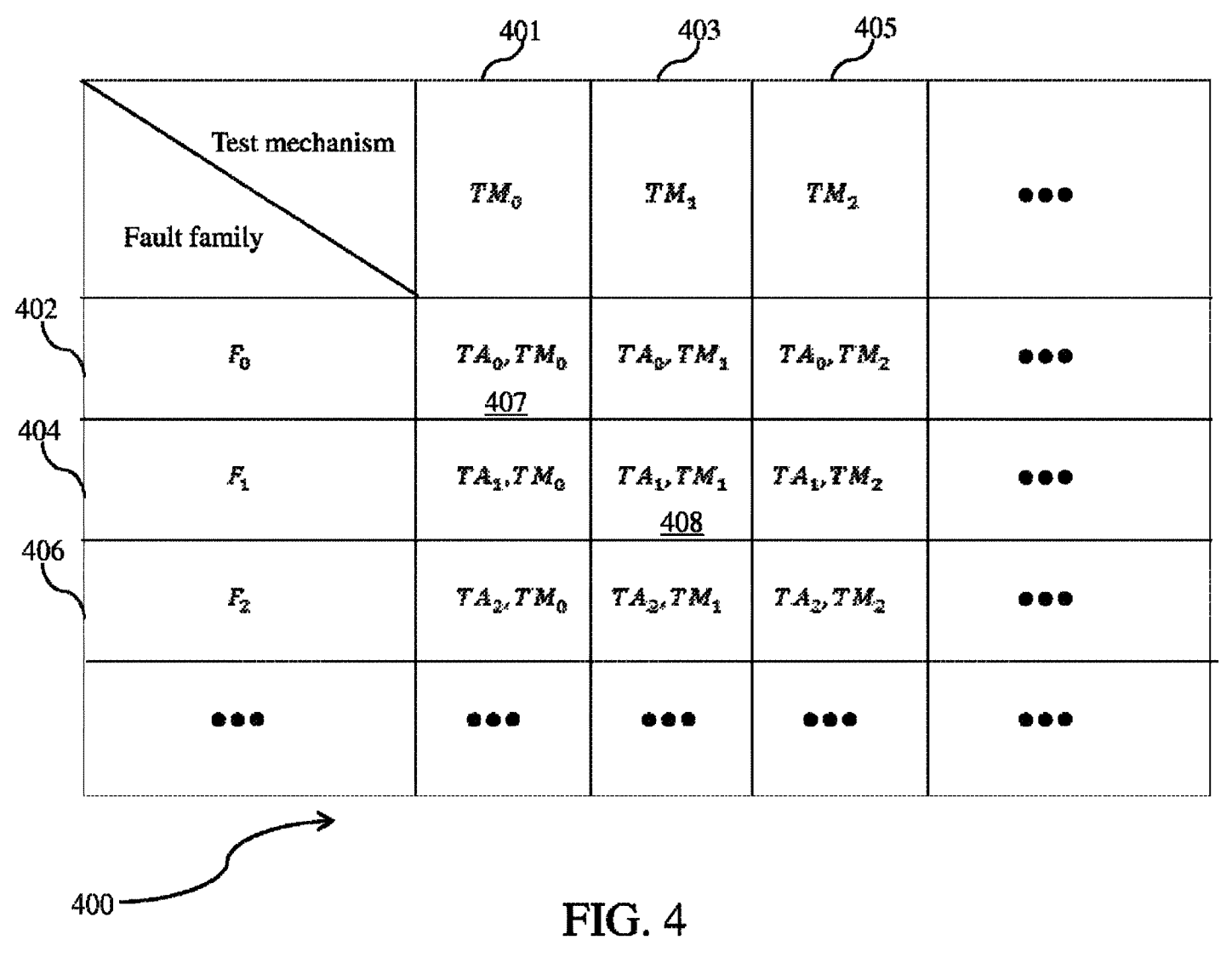

|  | $TM_0$ | $TM_1$ | $TM_2$ | ... |
|---|---|---|---|---|
| Test mechanism / Fault family | | | | |
| $F_0$ | $TA_0, TM_0$ <br> 407 | $TA_0, TM_1$ | $TA_0, TM_2$ | ... |
| $F_1$ | $TA_1, TM_0$ | $TA_1, TM_1$ <br> 408 | $TA_1, TM_2$ | ... |
| $F_2$ | $TA_2, TM_0$ | $TA_2, TM_1$ | $TA_2, TM_2$ | ... |
| ... | ... | ... | ... | ... |

FIG. 4

TESTING ELECTRONIC MEMORIES BASED ON FAULT AND TEST ALGORITHM PERIODICITY

CROSS-REFERENCES TO RELATED APPLICATIONS

This application is a continuation of U.S. application Ser. No. 13/183,468, filed on Jul. 15, 2011, entitled "TESTING ELECTRONIC MEMORIES BASED ON FAULT AND TEST ALGORITHM PERIODICITY", by Aram Hakhumyan, et al., the contents of which is incorporated herein by reference in its entirety.

TECHNICAL FIELD

Embodiments of the disclosure relate to testing of electronic memories based on fault and test algorithm periodicity.

BACKGROUND

Electronic memories can suffer from faults in a variety of modes. For example, in a stuck-at fault (SAF), a memory cell can remain constant at logical 0 or logical 1. In another example of a failure mode, in a deceptive read destructive fault (DRDF), a memory cell can flip state during a read operation but return an original correct value. Similarly, there are numerous other failure modes.

A built-in self-test (BIST) allows an electronic memory to be tested. The electronic memory can be subjected to the BIST either periodically, upon power-up, in response to an external signal or condition, or under other circumstances. A BIST test algorithm in the BIST typically comprises many elements, referred to as March elements. A March element includes a sequence of operations, for example write-0, write-1, and read-1, which are applied to a given memory cell before proceeding to a next memory cell. The BIST can proceed from memory cell to memory cell in an increasing order of addresses, or in a decreasing order of addresses, or in some arbitrary order of addresses. A sequence of March elements is defined as a March test.

There exists a notation that describes the March test as follows. A complete March test is delimited by a '{ ... }' parenthesis pair whereas a March element is delimited by a '( ... )' parenthesis pair. The March element can include a plurality of following operations, with notations as indicated: Increase address order, notated by ⇑. Decrease address order, notated by ⇓. Move through a sequence of addresses in an arbitrary manner, notated by ⇕. Write logical 0, write logical 1, read logical 0, read logical 1, notated respectively by W0, W1, R0 and R1. As an example of notation, the March test {⇕(W0), ⇑(R0,W1), ⇓(R1,W0)} instructs to write 0 to memory addresses in some arbitrary or pre-defined sequence, then to each memory cell in the increasing order of addresses read 0 and write 1 before going to the next memory cell, and finally to each memory cell in the decreasing order of addresses read 1 and write 0 before going to the next memory cell. It is the convention that when symbols ⇑ and ⇓ appear in one formula, the symbols represent address sequences that are exact reverses of each other. It is also convention that ~X represents logical opposite of a value represented by Boolean variable X.

A typical apparatus for BIST includes a finite state machine (BIST-FSM), an address generator, a data generator, and a programmable test algorithm register (TAR). The TAR holds information relating to the March elements, namely an addressing direction, an addressing type, an addressing mode, an operation code (that is, a sequence of read or write operations to be applied to each memory cell) and a pattern type (that is, a code that represents data to be written to the memory cells). The contents of the TAR are referred to as test algorithm, and are generated using a software tool that resides outside the BIST. The data generator creates patterns of data to be written to the memory cells during the test. Test data created by the data generator is referred to as a background pattern (BP). The BP can be pre-defined or programmed. The address generator creates signals along an address bus that locate address of a memory cell to be tested and thereby makes the memory cell ready for read or write.

Upon triggering of the BIST, the BIST-FSM of the apparatus reads data from the TAR, and thereby selects the addressing type, the addressing sequence, the code corresponding to the background data pattern, and the sequence of read or write operations. Based on the pattern type, the data generator generates the test data. Based upon the addressing direction, the addressing sequence and the addressing mode, the address generator selects the memory cell to be tested. Based upon the operation code, the test data is applied to the memory cell to be tested. The test algorithms, that is, the contents of the TAR that specify the March tests, are generated using a software tool that resides outside the BIST.

Hence, there is a need for a way to automatically generalize March tests to detect additional kinds of faults.

SUMMARY

An example of a processor unit for testing an electronic memory includes a built-in self-test (BIST) finite state machine that coordinates a plurality of BIST functions of the processor unit, an address generator in communication with the BIST finite state machine to generate addresses of memory cells for the testing, a data generator in communication with the BIST finite state machine that generates data patterns to be applied to the electronic memory, a test algorithm generation unit that generates March tests to be applied to the electronic memory, a programmable test algorithm register in communication with the test algorithm generation unit that stores one or more March elements generated by the test algorithm generator unit, and a test algorithm register control unit, coupled between the BIST finite state machine and the programmable test algorithm register, that enables the BIST finite state machine to determine presence of the one or more March elements stored in the programmable test algorithm register.

An example of a memory wrapper unit for testing an electronic memory includes an operation decoder, a data comparator, and the electronic memory. The operation decoder interprets an operation code. The data comparator compares a test data output with a data output from the electronic memory under test. The electronic memory under test is in communication with the operation decoder and the data comparator.

An example of a method of testing an electronic memory includes constructing a fault periodic table having a plurality of columns and a plurality of rows. Each of the plurality of columns corresponds with a functionality of a test mechanism of a plurality of test mechanisms, and each of the plurality of rows corresponds with a fault family of a plurality of fault families. The method also includes selecting a first March test sequence according to a first fault family of the plurality of fault families and a first test mechanism of the plurality of test mechanisms, and applying the first March test sequence to the electronic memory. The method further includes selecting a second March test sequence according to a second fault family of the plurality of fault families and a second test mechanism of the plurality of test mechanisms, and applying the second March test sequence to the electronic memory. Moreover, the method includes determining if the electronic memory under test is one of acceptable and unacceptable based on results of the first March test sequence and the second March test sequence.

BRIEF DESCRIPTION OF THE DRAWINGS

In the accompanying figures, similar reference numerals may refer to identical or functionally similar elements. These reference numerals are used in the detailed description to illustrate various embodiments and to explain various aspects and advantages of the present disclosure.

FIGS. 1A-1C illustrate March test algorithms used for testing an electronic memory, in accordance with one embodiment;

FIG. 4 is an exemplary illustration of a fault periodic table, in accordance with one embodiment;

DETAILED DESCRIPTION

Figure 2:
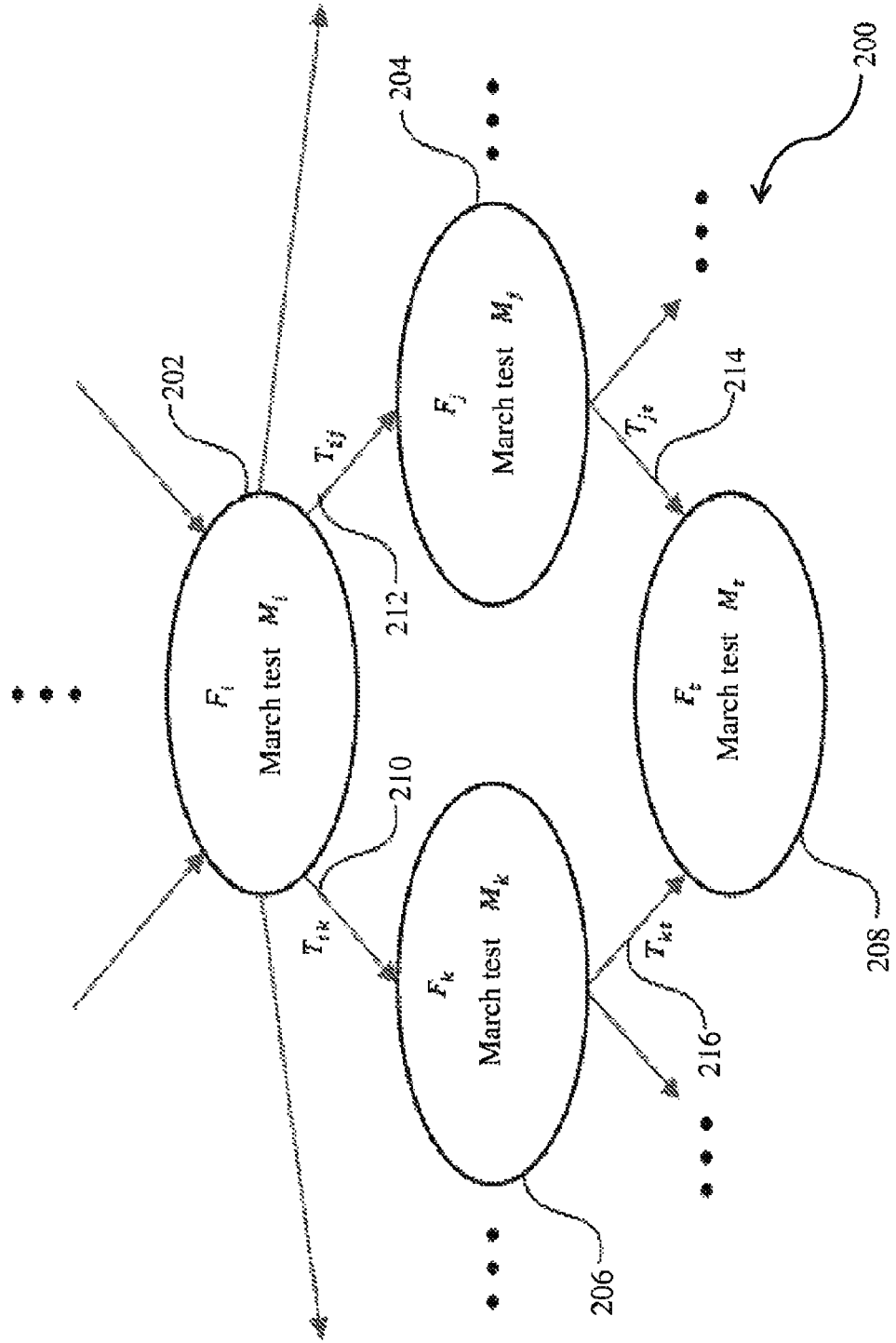
FIG. 2 is a schematic representation of a process by which a March test that detects one fault is generalized to other March tests that detect other faults, in accordance with one embodiment.

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

The present disclosure determines that properties of faults are periodic functions of lengths of a sequence of test operations that identifies a fault. Such a determination provides two devices, for example a test algorithm template and a fault periodic table. The present disclosure at first describes the test algorithm template, which is defined as a technique to generalize a March test in order to expand applicability of the March test to a larger set of faults. Application of the test algorithm template also causes the faults to naturally cluster into sets, referred to as fault families. A fault family is characterized by a length of a sequence of test operations. The present disclosure also describes the fault families and the fault periodic table. Having described the devices of test algorithm template and fault periodic table, the present disclosure further describes a built-in self-test (BIST) processor unit, that arranges, utilizes and co-ordinates the devices in a manner that achieves fault detection in an efficient, productive and exhaustive manner. The present disclosure also describes a memory wrapper unit that is required in order for fault testing when conducted by the BIST processor unit.

The term symmetric faults, as used in the disclosure, is to be interpreted as a pair of faults that are identical in every respect except for logical states of memory cells at fault, which are of opposite polarity. For example, stuck-at-0 and stuck-at-1 faults form a symmetric pair. A transition fault 1, in which a write-1 operation fails on a memory cell that includes logical 0 is symmetric with a transition fault 0, in which a write-0 operation fails on a memory cell that includes logical 1.

The term symmetric March test, as used in the disclosure, should be interpreted as the March test that executes a similar March element with one or more of different addressing directions, data polarities, and data background patterns. For example, the March test ⇑ (W0,R0); ⇑ (W1,R1) is symmetric, since element ⇑ (Wx,Rx) is repeated with two different polarities of data x.

The term test mechanism, as used in the disclosure, should be interpreted as a property of a test that characterizes the test. Examples of the property include, but is not limited to, a background pattern (one of checkerboard, solid-0, and solid-1), an addressing mode (FC: fast columns, that is, column-by-column addressing of memory or FR: fast rows, that is, row-by-row addressing of memory), an addressing type (binary, in which addresses are changed in the order 0, 1, . . . , N−1, or ping-pong, in which addresses are changed in the order 0, N−1, 2, N−2, . . . ), and operation concurrency (that is, two or more operations within a test sequence made simultaneously in time or sequentially).

In subjecting an electronic memory to tests, the following rules should be observed: (1) The symmetric March test is used so as to detect a fault that can have a symmetric counterpart. As an example, the symmetric March test ⇑ (W0,R0); (W1,R1) is used to detect a stuck-at fault (SAF), such that both symmetric varieties of the SAF, namely the SAF0 and the SAF1 are detected. (2) The March test for detecting a new fault can be constructed or generalized from an existing March test. In one example, the March test ⇑ (W0,R0); (W1,R1) is generalized by adding one or more write operations to each element, in order to obtain ⇑ (W0,W0,R0); (W1,W1,R1). (3) For thorough testing, the March test is normally applied with different test mechanisms. For example, if the March test ⇑ (W0,R0); (W1,R1) is executed under the fast-column (FC) mechanism, then it is also normal to execute the March test under the fast-row (FR) mechanism.

The term coupling fault, as used in the disclosure, should be interpreted as a fault that involves a pair of memory cells, and in which an operation on a first memory cell of the pair of memory cells can cause a fault in a second memory cell of the pair of memory cells. As an example, a write operation in the first, or coupling, memory cell can cause the second, or coupled, memory cell to flip in value.

Test Algorithm Template

The test algorithm template is a method disclosed herein to generalize March tests, in accordance with which various embodiments can be implemented. The test algorithm template starts with a sequence of test operations TO, and creates a March test, notated as TA, that has the following advantageous properties: (1) The faults detected by TO are also detected by TA. (2) TA is the symmetric March test. (3) If TA is capable of detecting a fault F1 that is one of a pair of symmetric faults (F1,F2) then TA is also capable of detecting a fault F2. (4) If TA is capable of detecting the coupling fault between two memory cells such that address of the coupled cell is greater than address of the coupling cell, then TA is also capable of detecting the coupling fault between two memory cells such that the address of the coupled cell is less than the address of the coupled cell.

In order to create the March test TA from the sequence of test operations TO, the test algorithm template needs a faulty value of a faulty memory cell, notated as A1, and initial value of the faulty memory cell, notated as A2. As such therefore the March test TA is a function of A1, A2 and TO, and therefore the test algorithm template is notated as TA(A1,A2,TO). It will be clear to one of ordinary skill in the art that A1 is a logical opposite of a final value generated by the sequence of test operations TO. It will also be clear to one of ordinary skill in the art that a test notated as ~TO represents a similar sequence of test operations as TO, except that data values being operated upon by ~TO are opposite in polarity to those being operated upon by TO. For example, if the TO is write-1 (W1) then the ~TO will be write-0 (W0). Within this disclosure, the sequence of test operations ~TO is referred to as the logical opposite of the sequence of test operations TO.

Figures 1A, 1B, 1C:
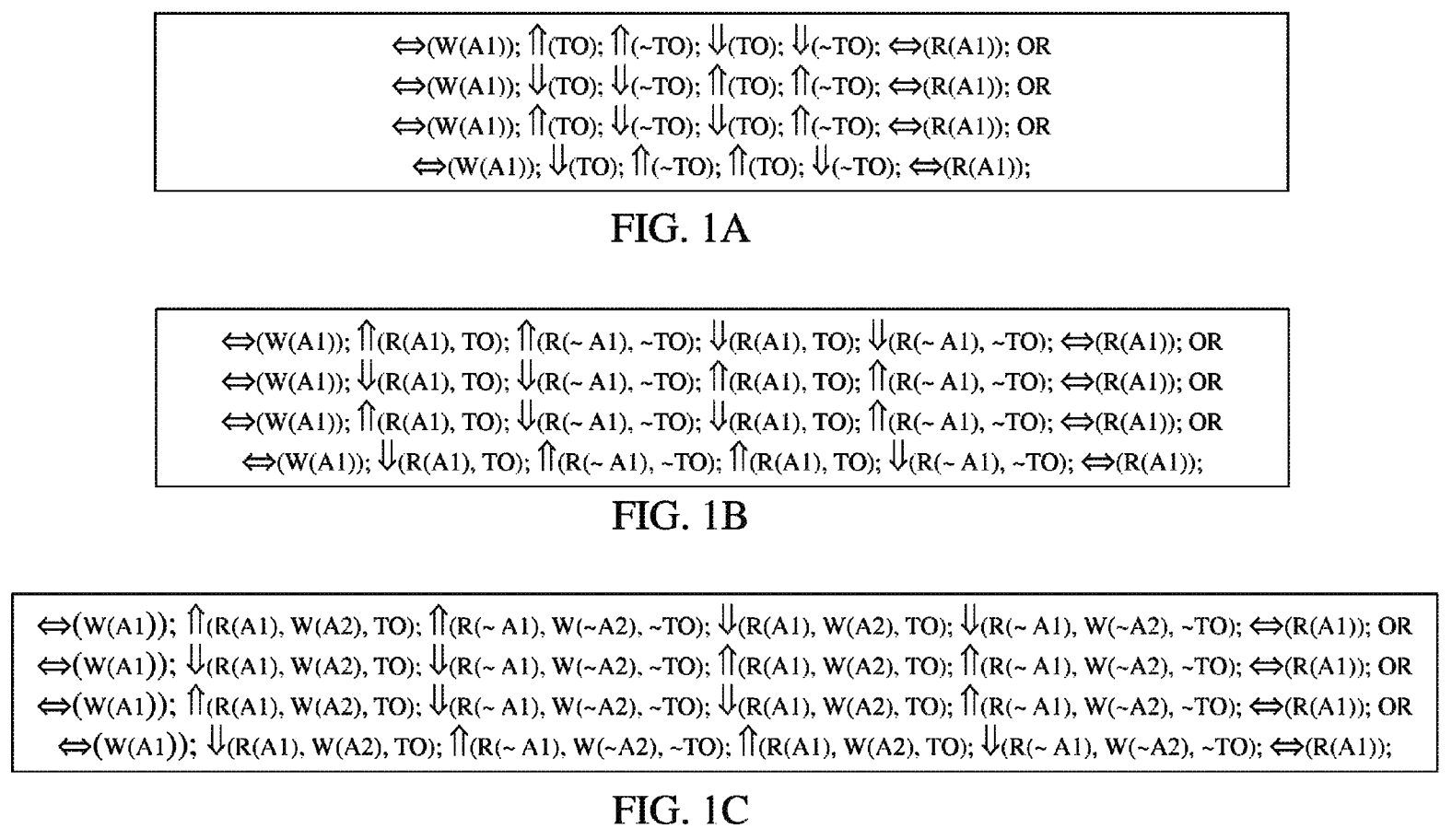

Different procedures by which the test algorithm template TA(A1,A2,TO) creates the March test TA from the sequence of test operations TO is illustrated in FIG. 1A, FIG. 1B, and FIG. 1C respectively.

FIG. 1A illustrates a plurality of cases when A1 equals A2 and a first operation of TO is a read-operation. Examples of the plurality of cases include, but are not limited to, a first case, a second case, a third case, and a fourth case. In the first case, the test algorithm template comprises the following steps:
(1) write A1 along an arbitrary order of addresses,
(2) execute the sequence of test operations TO along the increasing order of the addresses,
(3) execute the sequence of test operations ~TO along the increasing order of the addresses,
(4) execute the sequence of test operations TO along a decreasing order of the addresses,
(5) execute the sequence of test operations ~TO along the decreasing order of the addresses, and
(6) read A1 along the arbitrary order of the addresses.

In the second case, the test algorithm template comprises the following steps:
(1) write A1 along the arbitrary order of addresses,
(2) execute the sequence of test operations TO along the decreasing order of the addresses,
(3) execute the sequence of test operations ~TO along the decreasing order of the addresses,
(4) execute the sequence of test operations TO along the increasing order of the addresses,
(5) execute the sequence of test operations ~TO along the increasing order of the addresses, and
(6) read A1 along the arbitrary order of the addresses.

In the third case, the test algorithm template comprises the following steps:
(1) write A1 along the arbitrary of addresses,
(2) execute the sequence of test operations TO along the increasing order of the addresses,
(3) execute the sequence of test operations ~TO along the decreasing order of the addresses,
(4) execute the sequence of test operations TO along the decreasing order of the addresses,
(5) execute the sequence of test operations ~TO along the increasing order of the addresses, and
(6) read A1 along the arbitrary order of the addresses.

In the fourth case, the test algorithm template comprises the following steps:
(1) write A1 along the arbitrary order of addresses,
(2) execute the sequence of test operations TO along the decreasing order of the addresses,
(3) execute the sequence of test operations ~TO along the increasing order of the addresses,
(4) execute the sequence of test operations TO along the increasing order of the addresses,
(5) execute the sequence of test operations ~TO along the decreasing order of the addresses, and
(6) read A1 along the arbitrary order of the addresses.

FIG. 1B illustrates a plurality of cases when A1 equals A2 and the first operation of TO is not a read-operation. Examples of the plurality of cases include, but are not limited to, a first case, a second case, a third case, and a fourth case. In the first case, the test algorithm template comprises the following steps:
(1) write A1 along the arbitrary order of the addresses,
(2) read A1, then execute the sequence of test operations TO along the increasing order of the addresses,
(3) read ~A1, then execute the sequence of test operations ~TO along the increasing order of the addresses,
(4) read A1, then execute the sequence of test operations TO along the decreasing order of the addresses,
(5) read ~A1, then execute the sequence of test operations ~TO along the decreasing order of the addresses, and
(6) read A1 along the arbitrary order of the addresses.

In the second case, the test algorithm template comprises the following steps:
(1) write A1 along the increasing order of the addresses,
(2) read A1, then execute the sequence of test operations TO along the decreasing order of the addresses,
(3) read ~A1, then execute the sequence of test operations ~TO along the decreasing order of the addresses,
(4) read A1, then execute the sequence of test operations TO along the increasing order of the addresses,
(5) read ~A1, then execute the sequence of test operations ~TO along the increasing order of the addresses, and
(6) read A1 along the arbitrary order of the addresses.

In the third case, the test algorithm template comprises the following steps:
(1) write A1 along the increasing order of the addresses,
(2) read A1, then execute the sequence of test operations TO along the increasing order of the addresses,
(3) read ~A1, then execute the sequence of test operations ~TO along the decreasing order of the addresses, (4) read A1, then execute the sequence of test operations TO along the decreasing order of the addresses,
(5) read ~A1, then execute the sequence of test operations ~TO along the increasing order of the addresses, and
(6) read A1 along the arbitrary order of the addresses.

In the fourth case, the test algorithm template comprises the following steps:
(1) write A1 along the increasing order of the addresses,
(2) read A1, then execute the sequence of test operations TO along the decreasing order of the addresses,
(3) read ~A1, then execute the sequence of test operations ~TO along the increasing order of the addresses,
(4) read A1, then execute the sequence of test operations TO along the increasing order of the addresses,
(5) read ~A1, then execute the sequence of test operations ~TO along the decreasing order of the addresses, and
(6) read A1 along the arbitrary order of the addresses.

FIG. 1C illustrates a plurality of cases when A1 does not equal A2. Examples of the plurality of cases include, but are not limited to, a first case, a second case, a third case, and a fourth case. In the first case, the test algorithm template comprises the following steps:
(1) write A1 along the arbitrary order of the addresses,
(2) read A1, then write A2, then execute the sequence of test operations TO along the increasing order of the addresses,
(3) read ~A1, then write ~A2, then execute the sequence of test operations ~TO along the increasing order of the addresses,
(4) read A1, then write A2, then execute the sequence of test operations TO along the decreasing order of the addresses,
(5) read ~A1, then write ~A2, then execute the sequence of test operations ~TO along the decreasing order of the addresses, and
(6) read A1 along the arbitrary order of the addresses.

In the second case, the test algorithm template comprises the following steps:
(1) write A1 along the arbitrary order of the addresses,
(2) read A1, then write A2, then execute the sequence of test operations TO along the decreasing order of the addresses,
(3) read ~A1, then write ~A2, then execute the sequence of test operations ~TO along the decreasing order of the addresses,
(4) read A1, then write A2, then execute the sequence of test operations TO along the increasing order of the addresses,
(5) read ~A1, then write ~A2, then execute the sequence of test operations ~TO along the increasing order of the addresses, and
(6) read A1 along the arbitrary order of the addresses.

In the third case, the test algorithm template comprises the following steps:
(1) write A1 along the arbitrary order of the addresses,
(2) read A1, then write A2, then execute the sequence of test operations TO along the increasing order of the addresses,
(3) read ~A1, then write ~A2, then execute the sequence of test operations ~TO along the decreasing order of the addresses,
(4) read A1, then write A2, then execute the sequence of test operations TO along the decreasing order of the addresses,
(5) read ~A1, then write ~A2, then execute the sequence of test operations ~TO along the increasing order of the addresses, and
(6) read A1 along the arbitrary order of the addresses.

In the fourth case, the test algorithm template comprises the following steps:
(1) write A1 along the arbitrary order of the addresses,
(2) read A1, then write A2, then execute the sequence of test operations TO along the decreasing order of the addresses,
(3) read ~A1, then write ~A2, then execute the sequence of test operations ~TO along the increasing order of the addresses,
(4) read A1, then write A2, then execute the sequence of test operations TO along the increasing order of the addresses,
(5) read ~A1, then write ~A2, then execute the sequence of test operations ~TO along the decreasing order of the addresses, and
(6) read A1 along the arbitrary order of the addresses.

Examples of Test Generalization and Creation Using the Test Algorithm Template As an illustrative example, consider a case when the sequence of test operations TO comprises no operations, that is, TO equals an empty set Ø. Since TO performs no operations, and yet a fault is manifested, A1 does not equal A2. As described in above test algorithm templates, an applicable case is the third case, illustrated in FIG. 1C. Applying the steps of the third case, i.e., FIG. 1C, the March test TA, now designated $TA_o$, is generated as follows:

$$TA_o = TA(0,1,\emptyset) = \Uparrow (W0); \Uparrow (R0,W1); \Uparrow (R1,W0);$$
$$\Downarrow (R0,W1); \Downarrow (R1,W0); \Downarrow (R0).$$

It will be clear to one of ordinary skill in the art that test $TA_o$ generated in the above example detects state faults, examples of which are stuck-at faults and state-coupling faults.

In another example of the test generalization and creation using the method of the test algorithm template, consider the sequence of test operations TO to equal an operation {0W1W1R1}. The first operation 0W1 of the sequence of test operations TO detects a transition fault, which is defined as a fault that causes the memory cell to fail to respond to a write −1 when initial value of the memory cell is 0. In such a case, the initial value of the memory cell is A2=0. A1, which is opposite of the final value of the memory cell at the termination of TO, is A1=0. Therefore, A1 equals A2 and the first operation of TO is not a read-operation. Therefore, the second case as illustrated in FIG. 1B, applies and the March test TA, now designated $TA_1$, is generated as follows:

$$TA_1 = TA(0, 0, \{W1, W1, R1\})$$
$$= \Uparrow (W0); \Uparrow (R0, W1, W1, R1) \Uparrow; (R1, W0, W0, R0);$$
$$\Downarrow (R0, W1, W1, R1); \Downarrow (R1, W0, W0, R0); \Downarrow (R0)$$

It will be clear to one of ordinary skill in the art that test $TA_1$ generated in the above example is a smallest length (minimal) March test that detects the static faults.

Fault Families

The fault family is a classification of faults based upon the length of the sequence of test operations, in accordance with which various embodiments can be implemented. A method of classifying the faults into the fault families is now disclosed as follows. A fault is defined to belong to a fault family $F_k$ if the sequence of test operations that identifies the fault has k operations. Since state faults such as stuck-at faults and state-coupling faults need no operations to be identified, it is clear that the state faults belong to $F_o$. It is also clear from properties inherent to the test algorithm template and described above that the March test $TA_o$ is capable of detecting the state faults that belong to $F_o$. Similarly, as $TA_1$ is generated out of the sequence of test operations TO that can detect one type of transition fault, the March test $TA_1$ is capable of detecting transition faults that belong to $F_1$.

Other Methods of March Test Generalization are Possible

The disclosure can provide other methods of generalization of March tests, for example a method 200 illustrated in FIG. 2. In the method 200, a March test $M_i$ that makes manifest a fault family $F_i$, both illustrated in a block 202, is subjected to a transformation $T_{ik}$ 210, in order to generate a new March test $M_k$ that makes manifest a fault family $F_k$, illustrated in a block 206. Similarly, the March test in the block 202 is transformed via transformation $T_{ij}$ 212 in order to get the March test $M_j$ and associated fault family $F_j$ in block 204. Furthermore, it is possible for two March tests to be individually or jointly transformed in order to produce a third March test, as for example the March tests in blocks 204 and 206 that are respectively subject to transformations 214 and 216 in order to generate the March test Mt with associated fault family $F_t$ in block 208.

Figure 3A:
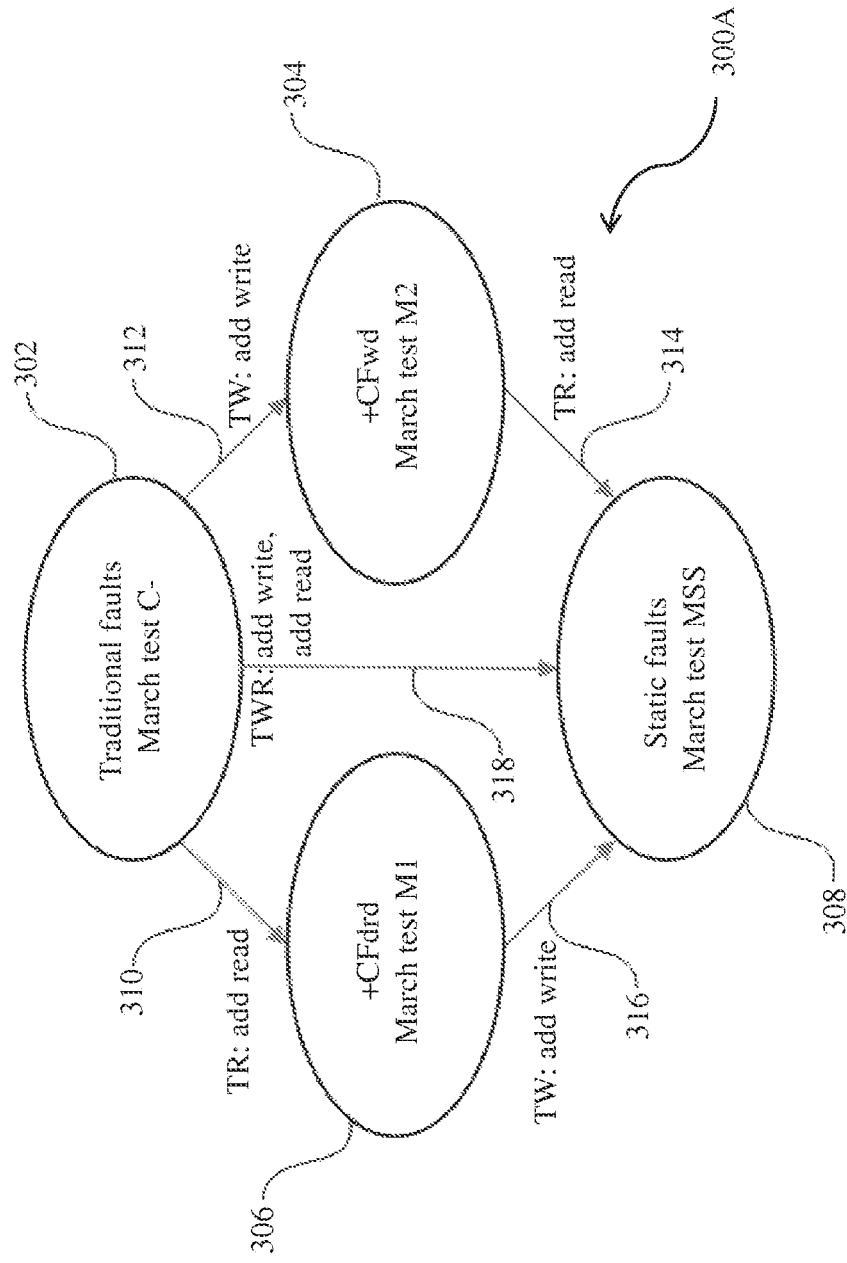
FIG. 3A is an illustrative example of a process by which a March test is generalized, in accordance with one embodiment.
Figure 3B:
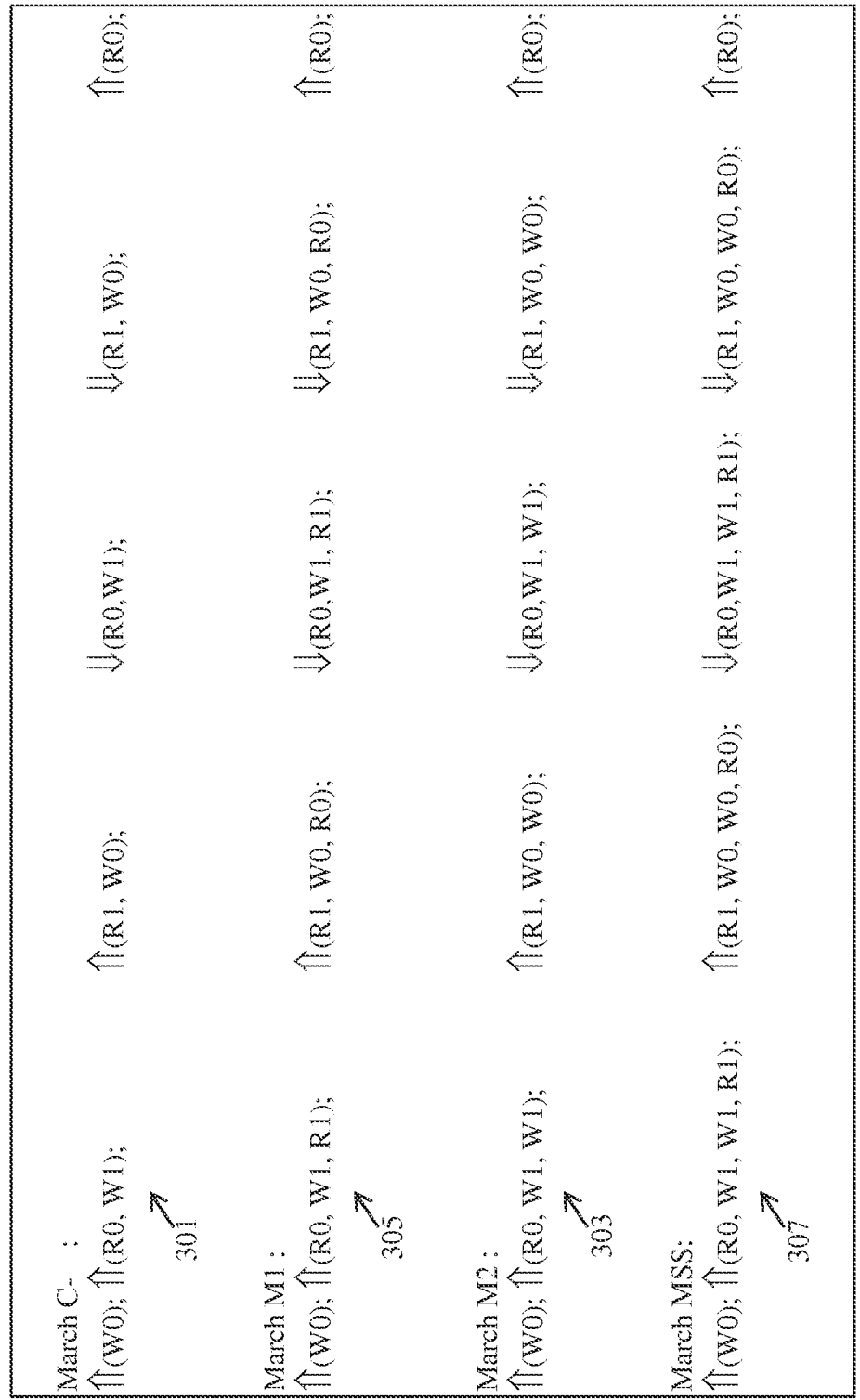
FIG. 3B is an exemplary illustration of an addressing order and sequence of read and write operations associated with a plurality of March tests, in accordance with one embodiment.

An illustrative example of the method 200 is depicted in FIG. 3A and FIG. 3B. Three transformations are illustrated in FIG. 3A: (1) Transformation TR: add read, which adds a read operation to every March element of an input March test save first and last elements; (2) Transformation TW: add write, which adds a write operation to every March element of the input March test save the first and last elements; and (3) Transformation TWR: add write, add read, which adds first a write operation then a read operation to every March element of the input March test save the first and last elements. In block 302 of FIG. 3A is a March test referred to as March test C-, which can be recognized by one of ordinary skill in the art as formula 301 in FIG. 3B. To the March test C- of the block 302 is applied transformation 310, which is a transformation of type TR: add read. Upon applying the transformation, the March test is then represented by formula 305 in FIG. 3B, which will be recognized by one of ordinary skill in the art as March test M1. The March test M1 is illustrated in block 306. To the March Test M1 of the block 306 is applied transformation 316, which is a transformation of type TW: add write, and the March test is then represented by formula 307 of FIG. 3B, which can be recognized by one of ordinary skill in the art as March Test MSS, also illustrated as block 308 in FIG. 3A. As a further illustration of the process by which a test can be generalized, the March Test C- of the block 302 is applied transformation 312, which is of type TW: add write. Upon applying the transformation 312, the March test is then represented by formula 303 of FIG. 3B, which will be recognized by one of ordinary skill in the art as March test M2, also represented in block 304 of FIG. 3A. Applying transformation 314, of type TR: add read to the March test M2 in the block 304, the March test MSS illustrated as the block 308 is then represented by the formula 307 of FIG. 3B. Alternately, one can generate the March test MSS of the block 308 directly from the March test C- by means of the transformation 318, which is of type TWR: add write, add read.

It will be clear to one of ordinary skill in the art that one or more methods of test generalization can be used in order to expand applicability of a given test such that a larger family of faults is detected. The present disclosure can thus invoke method of test generalization in various embodiments including, but not limited to, the methods described above.

Fault Periodic Table

The fault periodic table is an arrangement of faults in a tabular form indexed by associated fault families and by the test mechanism used to detect the faults, in accordance with which various embodiments can be implemented. Apart from systematizing the faults in a way that allows easier recall of related properties, the fault periodic table enables prediction of the properties of unknown faults, and thereby enabling generation of the March tests that make apparent the unknown faults.

Principle of the fault periodic table is that the properties of the faults are periodic functions of the lengths of the sequence of test operations that identifies the fault. In arranging the faults row-wise by fault-family and column-wise by test mechanism, the faults with similar properties cluster, and different such clusters have dissimilar properties. Choice of nomenclature makes it clear that inspiration for the fault periodic table is Mendeleyev's Periodic Table of chemical elements.

A fault periodic table 400 and a method of constructing the fault periodic table 400 are illustrated in FIG. 4. A March test $TA_o$ that makes manifest the faults belonging to a fault family $F_o$ is associated with a plurality of test mechanisms that include, but are not limited to, $TM_0$, $TM_1$ and $TM_2$. Such associations, that is, $(TA_0,TM_0)$, $(TA_0,TM_1)$, and $(TA_0, TM_2)$, are arranged in a row 402 that is indexed by the fault family $F_0$. Similarly, a March test $TA_1$ that makes manifest the faults belonging to a fault family is associated with a plurality of test mechanisms that include, but are not limited to, $TM_0$, $TM_1$, and $TM_2$. Such associations, that is, $(TA_1, TM_0)$, $(TA_1,TM_1)$, and $(TA_1,TM_2)$ are arranged in a row 404 indexed by the fault family $F_1$. Row 406 that is indexed by the fault family $F_2$ is constructed, and the fault periodic table 400 can be extended along the row-dimension as far as desired. It is evident that row-wise arrangement described is consequent to column-wise arrangement of the faults, each column headed by a test mechanism, for example $TM_0$ (column 401), $TM_1$ (column 403), $TM_2$ (column 405) and so on. The construction of the fault periodic table 400 can be described column-first, in contrast but equivalent to row-first description adopted herein. At an intersection of a row and a column lie elements of the fault periodic table 400, for example element 407 which is $(TA_0,TM_0)$ and is at the intersection of the row 402 and the column 401, or element 408 which is $(TA_1,TM_1)$ and is at the intersection of the row 404 and the column 403.

Predictive power of the fault periodic table 400 arises from an observation that the faults that are made manifest by an element along a first row of the table exhibit properties that are similar to the faults that are made manifest by elements below the element. That is, the faults that are manifest by the elements along a column of the fault periodic table 400 have similar properties. In an exemplary application of the predictive power, if an element of the fault periodic table 400 detects a fault, then another element below the element can also detect a similar but different fault. In another application of the predictive power, if first several elements of a column pass then it can be an indication that no further faults are found by investigating later complex elements along the column. In this way, fault testing can proceed along paths as identified by the fault periodic table 400 resulting in following benefits: (1) Efficiency: Tests that are likely to pass are less likely to be conducted (2) Productiveness: Tests that are likely to fail are likely to be conducted (3) Exhaustiveness: A fault detected by an element in upper sections of a column can direct further fault testing to be conducted along paths that uncover obscure or rarely manifested faults.

It will be clear to one of ordinary skill in the art that fault coverage can be extended by considering new fault families or adding new test mechanisms, that is, by moving horizontally along the fault periodic table or by adding new columns to the fault periodic table. The method of adding new test mechanisms in order to extend fault coverage is not mutually exclusive with, and is in addition to, other methods of extending fault coverage disclosed herein, for example the test algorithm template, or the method 200 described in FIG. 2, and exemplified in FIG. 3A and FIG. 3B.

The present disclosure can apply the predictive power of the fault periodic table in various embodiments in order to achieve automated extension of the fault coverage in an efficient, productive and exhaustive manner.

BIST Processor Unit Capable of Automated Test Generation and Extension

Figure 5:
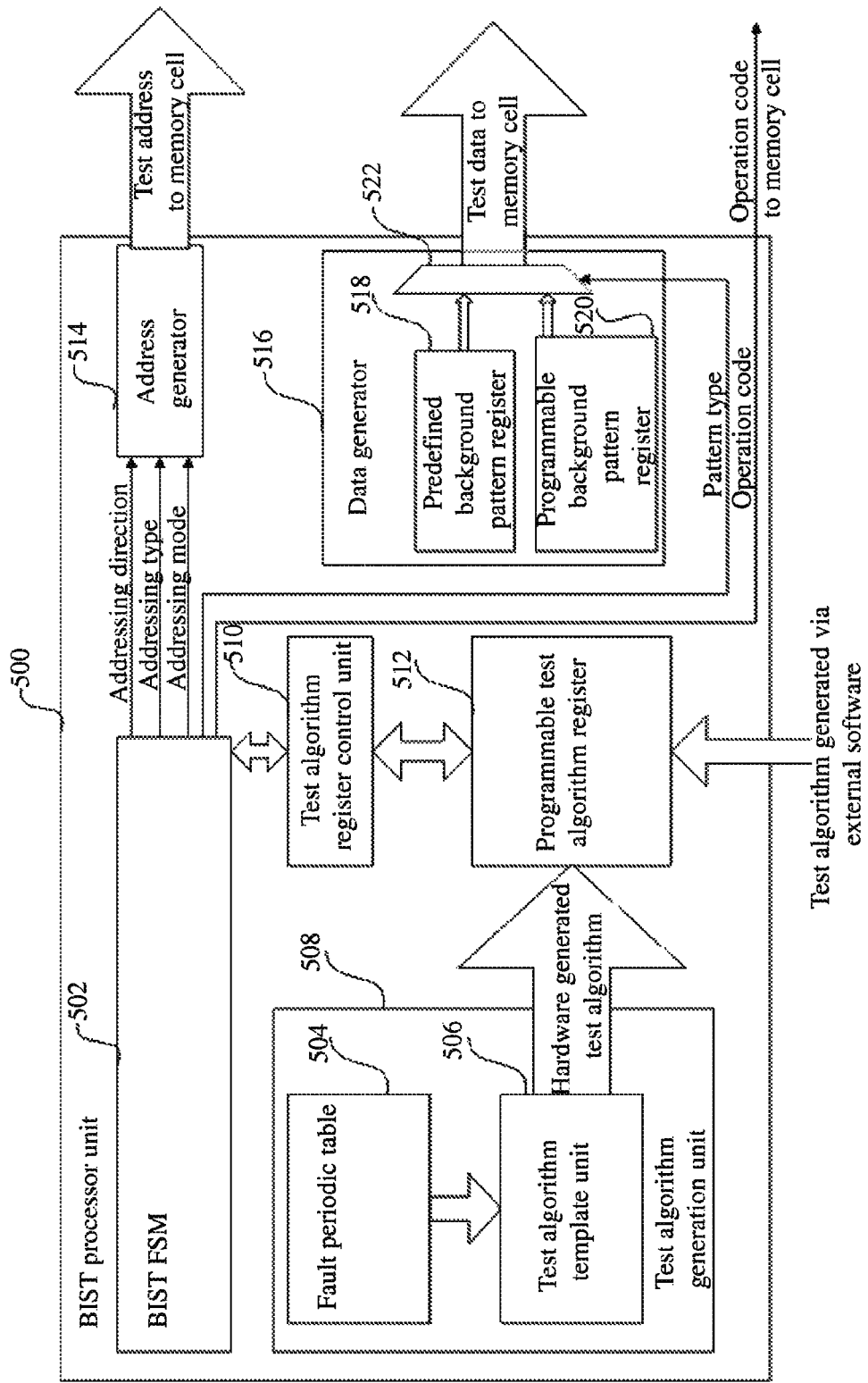
FIG. 5 is a block diagram of a built-in self-test processor unit, in accordance with one embodiment.

FIG. 5 illustrates the architecture of a built-in self-test (BIST) processor unit 500 that is capable of automated generation and execution of March tests, thereby operating over and above a traditional mode of executing the March tests that have been externally created. Within the BIST processor unit 500 is a BIST finite state machine (BIST-FSM) 502 that co-ordinates actions of other units. The BIST-FSM 502 executes its duties by means of an unending sequence of traversals through various states, described in detail in conjunction with FIG. 6. A test algorithm generation unit 508 is responsible for generation of the March tests. The test algorithm generation unit 508 includes a fault periodic table 504 and a test algorithm template unit 506. Upon generation of a March test, the March test is loaded into a programmable test algorithm register 512. The programmable test algorithm register 512 is also capable of being fed with the March tests by means of external generation and loading of the March tests. Regardless of whether the March test is pre-defined, loaded after the external generation, or generated within the test algorithm generation unit 508 of the BIST processor unit 500, steps for execution of a March test sequence remain unchanged. The programmable test algorithm register 512, including multiple fields, is explained in detail in conjunction with FIG. 7A and FIG. 7B. A field of the programmable test algorithm register 512 that needs to be selected in order for a test to run depends on the state of the BIST-FSM 502, and depending on a selected field, a certain set of addresses, directions and operations are directed towards the electronic memory under test. Therefore, it is necessary to have an interface between the programmable test algorithm register 512 and the BIST-FSM 502. Such an interface function is performed by a test algorithm register control unit 510, which transmits information between the BIST-FSM 502 and the programmable test algorithm register 512.

The BIST-FSM 502 thus co-ordinates activities of the test algorithm generation unit 508 and the programmable test algorithm register 512 in order to make available the March test. The BIST-FSM 502 then executes the March test. The March test includes a sequence of operations and test mechanisms and further includes addressing direction (that is ⇑ or ⇓), an addressing type (that is, the addressing sequence 0, 1, . . . , N−1 or a sequence 0, N−1, 1, N−2, . . . . or some other addressing sequence), an addressing mode (for example, fast-column or fast-row), an operation code (for example, read-from-memory, write-to-memory, enable-write, and so on) and data pattern (for example, solid-0, checkerboard, and so on) to be applied to the electronic memory. The BIST-FSM 502 then sends address-related information, that is, the addressing direction, the addressing type and the addressing mode, to the address generator 514. The address generator 514 uses information received from the BIST-FSM 502 in order to generate address of the memory cell that is to be tested. The BIST-FSM 502 sends data related information, that is, pattern type to a data generator 516. The data generator 516 interprets the pattern type in order to excite one of a predefined background pattern register 518, or a programmable background pattern register 520, in order to generate the data pattern to be applied to the address selected by the address generator 514. The predefined background pattern register 518 includes a set of patterns that are pre-loaded. The programmable background pattern register 520 enables new background data patterns (arising perhaps due to new test mechanisms) to be loaded. Examples of the background data patterns include, but are not limited to, solid-0 which entails writing logical 0 to memory cells under test; solid-1 which entails writing logical 1 to the memory cells under test, and checkerboard which entails writing the pattern 010101 . . . on even rows and the pattern 101010 . . . on odd rows. A multiplexer 522 allows selection of test data output from one of the programmable background pattern register 520 and the predefined background pattern register 518. A combination of test address as computed by the address generator 514, the data value as generated by the data generator 516 and the operation code as generated by the BIST-FSM 502 are transmitted via a test bus to an electronic memory cell under test, which in turn performs in a manner described in detail in conjunction with FIG. 8.

State Diagram of the BIST-FSM

Figure 6:
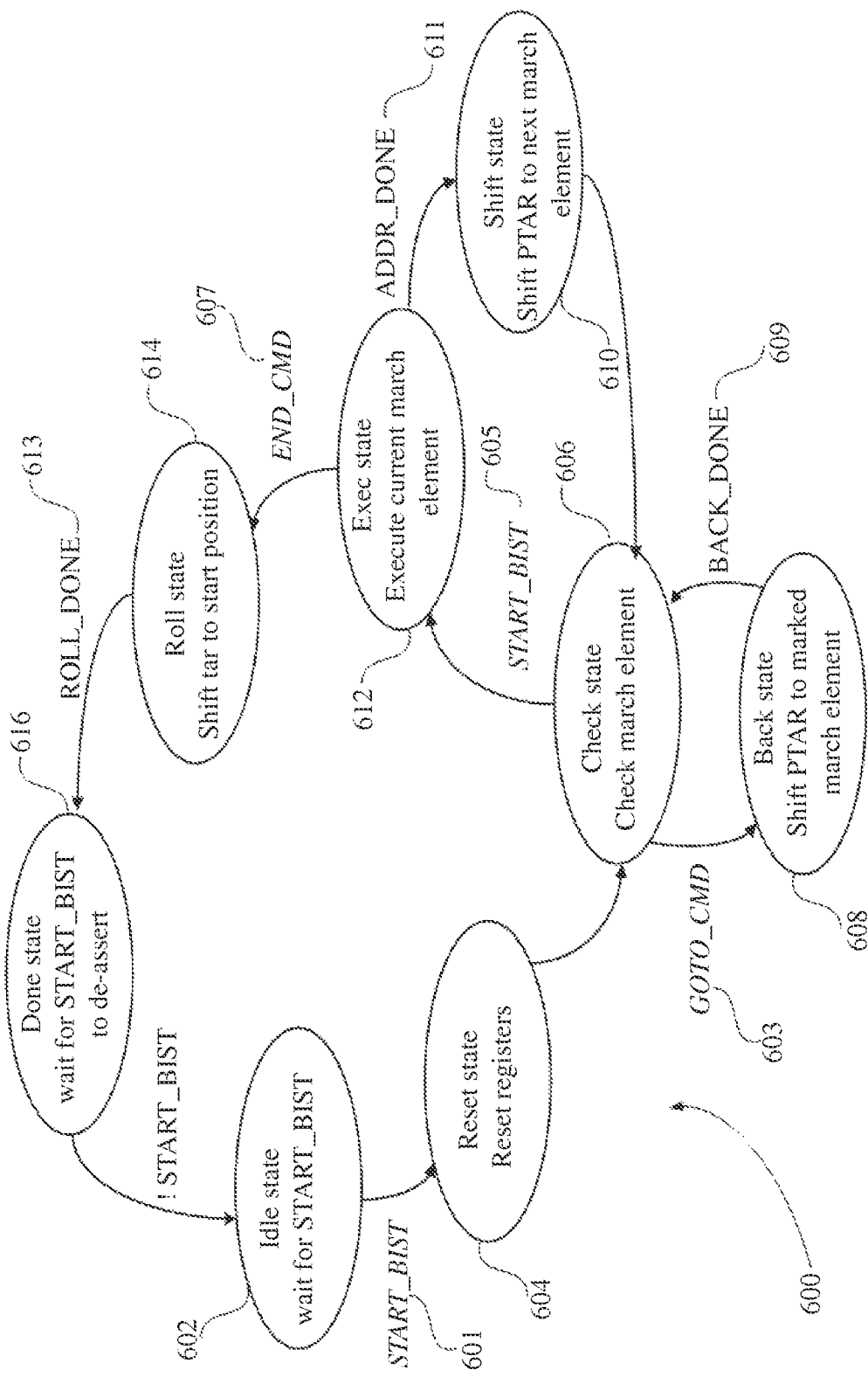
FIG. 6 is a state diagram illustrating a plurality of states assumed by a built-in self-test processor unit, in accordance with one embodiment.

FIG. 6 is a state diagram 600 illustrating the states that the BIST-FSM 502 traverses in performing associated duties. The BIST-FSM 502 can transition from one state to another in response to an input signal, and in thus transitioning, emits an output signal. In FIG. 6, input signals, for example signals 601, 603, 605, 607 are in italicized font and output signals, for example signals 609, 611, 613 are in regular font. A quiescent state of the BIST-FSM 502 is an idle state 602, in which the BIST-FSM 502 waits for a signal START_BIST 601, in order to start a testing process. Typically, the signal START_BIST 601 is supplied by a module that hosts the BIST processor unit 500. The BIST-FSM 502 then transitions to a reset state 604, in which registers within the BIST processor unit 500 are reset. Following completion of the reset state 604, the BIST-FSM 502 transitions to a check state 606, in which the BIST-FSM 502 reads (via the test algorithm register control unit 510) contents of the programmable test algorithm register (PTAR) 512 and thereby configures the address generator 514 and the data generator 516. If, upon reading the contents of the programmable test algorithm register 512, a NumofOps field is found to be equal to 6, then it is equivalent to issuing to the BIST-FSM 502 a command GOTO_CMD 603, which causes the BIST-FSM 502 to transition to a back state 608. A task performed by the BIST-FSM 502 in the back state 608 is to effect a shift of the programmable test algorithm register 512 to a marked test element. Purpose of the shift is to repeat the test indicated by shifted-to test element under a different test mechanism in order to achieve complete test coverage. Once tasks of the back state 608 are completed, the BIST-FSM 502 transitions back to the check state 606, and in thus transitioning issues a signal BACK_DONE 609. At the check state 606, if the signal START_BIST 605 is found to be active, then the BIST-FSM 502 transitions to an exec state 612, which is an executive state of the BIST-FSM 502. A principal task of the exec state 612 is to execute the test indicated by the test element read in the check state 606. As such the task would entail exercising the address generator 514 and the data generator 516 and related parts in order to apply data patterns and operations to addressed memory. When testing task of the exec state 612 is completed, the BIST-FSM 502 checks if there are more tests to be run, by checking for presence of an active end field in the test element. If the end field is not active then there are more tests to be run, and the BIST-FSM 502 transitions to a shift state 610, and in thus transitioning issues signal ADDR_DONE 611. In the shift state 610 the BIST-FSM 502 moves to a next test held in the programmable test algorithm register 512. However, if the end field is active then a command END_CMD 607 is issued to the BIST-FSM 502, which causes the BIST-FSM 502 to wind down testing by moving through a final set of states. The final set of states and related tasks are as follows: a roll state 614, in which the programmable test algorithm register 512 is shifted to starting position and a done state 616, which is a type of quiescent state in which the BIST-FSM 502 waits for the signal START_BIST 601 to de-assert. In transitioning from the roll state 614 to the done state 616, the BIST_FSM 502 emits the output signal ROLL_DONE 613. Once the signal START_BIST 601 is de-asserted, the BIST_FSM 502 moves from the done state 616 to its initial quiescent state, the idle state 602.

Programmable Test Algorithm Register

Figure 7A:
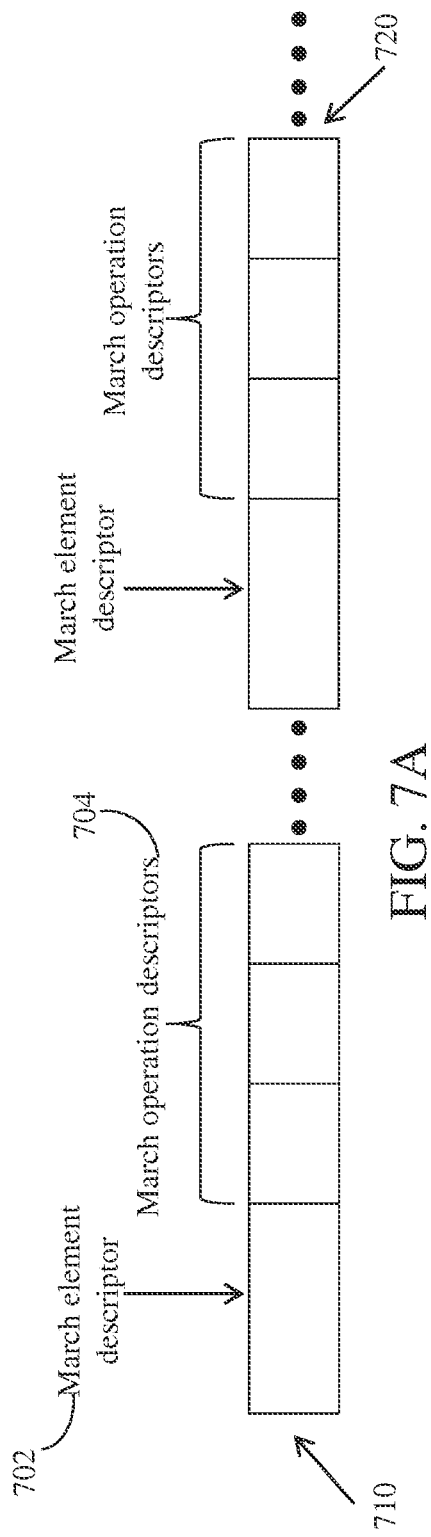
FIG. 7A illustrates a programmable test algorithm register in a built-in self-test processor unit, in accordance with one embodiment.
Figure 7B:
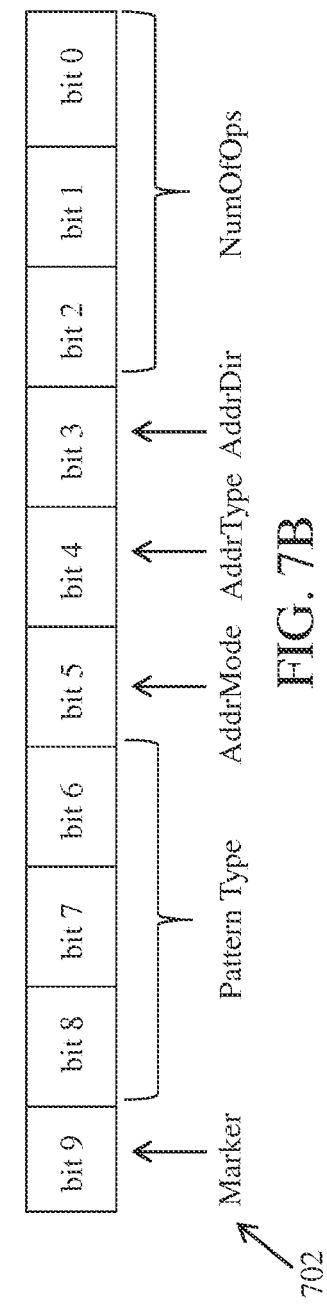
FIG. 7B illustrates a first field of a programmable test algorithm register, in accordance with one embodiment.
Figure 7C:
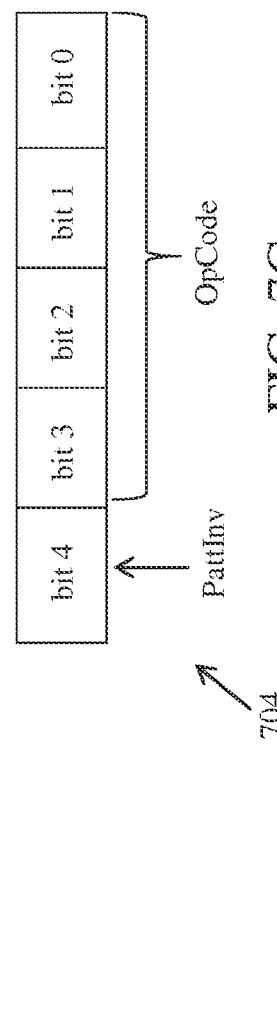
FIG. 7C illustrates a second field of a programmable test algorithm register, in accordance with one embodiment.

FIG. 7A and FIG. 7B illustrate the contents and organization of the programmable test algorithm register 512, in accordance with one embodiment. FIG. 7A illustrates that the programmable test algorithm register 512 can hold several March elements, for example a March element 710, and a March element 720. Each March element, for example the March element 710 has at least two fields, a March element descriptor field 702, and one or more instances of March operation descriptors field 704. The March element descriptor field 702 has at least six sub-fields as described in FIG. 7B: (1) a marker sub-field represented by bit 9, which if set to 1, saves position of a current March element for further TAR rollbacks; (2) the pattern type represented by bits 6-8, which indicates the type of data background pattern to be written to the electronic memory under test; (3) the addressing mode sub-field (AddrMode) represented by bit 5, which indicates if a rectangular memory array under test needs to be addressed in a fast column manner or in a fast row manner; (4) an addressing type sub-field (AddrType) represented by bit 4, which indicates if the addressing sequence should be in a binary order 0, 1, . . . , N−1, or in a ping-pong sequence, that is in the order 0, N−1, 1, N−2, . . . , or some other order, where N is number of addresses; (5) the addressing direction sub-field (AddrDir) represented by bit 3, which indicates the direction (⇑ or ⇓), of the addressing sequence; and (6) number of operations sub-field (NumOfOps) represented by bits 0-2, which indicates number of operations within the current March element if NumOfOps≤5 else special commands are applied: NumOfOps=i, 0≤i≤5: (i+1) operations; NumOfOps=6: goto command; and NumOfOps=7: end command. The sub-fields of the March element descriptor 702 are read by the BIST-FSM 502 and transmitted to the address generator 514 and the data generator 516 at time of execution of the March element. The March operation descriptors field 704, as described in FIG. 7C, determines type of each individual March operation and includes an inverse pattern sub-field (PattInv) and opcode sub-fields. PattInv, represented by bit 4, determines polarity of the data background pattern for a direct or inverse pattern. OpCode, represented by bits 0-3, determines type of operation. In some embodiments, the March operation descriptors field 704 represent the sequence of operations, for example write-enable, read-enable, or memory-enable, that are to be performed in each memory cell addressed by the address generator 514.

When applying the March element descriptor 702 with a goto command, some fields of the March element descriptor 702 change in interpretation as given below:

If AddrDir is equal to 1 then the addressing order for a repeated set of March elements is be inversed, that is if a March element is originally ⇑ (R0,W1,R1), when repeating, the March element becomes ⇓ (R0,W1,R1). Otherwise, if AddrDir is equal to 0 then a similar addressing order for the repeated set of March elements is used;

If AddrType is equal to 1 then the polarity of background data for the repeated set of March elements is inversed, that is if the March element is originally ⇑ (R0,W1,R1), when repeating, the March element becomes ⇑ (R1,W0,R0). Otherwise, if AddrType is equal to 0 similar polarity of the background data for the repeated set of March elements is used;

If AddrMode is equal to 1 then an opposite addressing mode for the repeated set of March elements is inversed, that is if the March element originally used fast column addressing mode, when repeating, the March element uses fast row addressing mode. Otherwise, if AddrMode is equal to 0 similar addressing mode for the repeated set of March elements is used;

If pattern type is equal to the pattern type of a repeated March element then similar data background pattern is used for the repeated set of March elements, otherwise if the pattern type differs from the pattern type of the repeated March element, then pattern type from the March element descriptor is used with the goto command.

Memory Wrapper Unit

Figure 8:
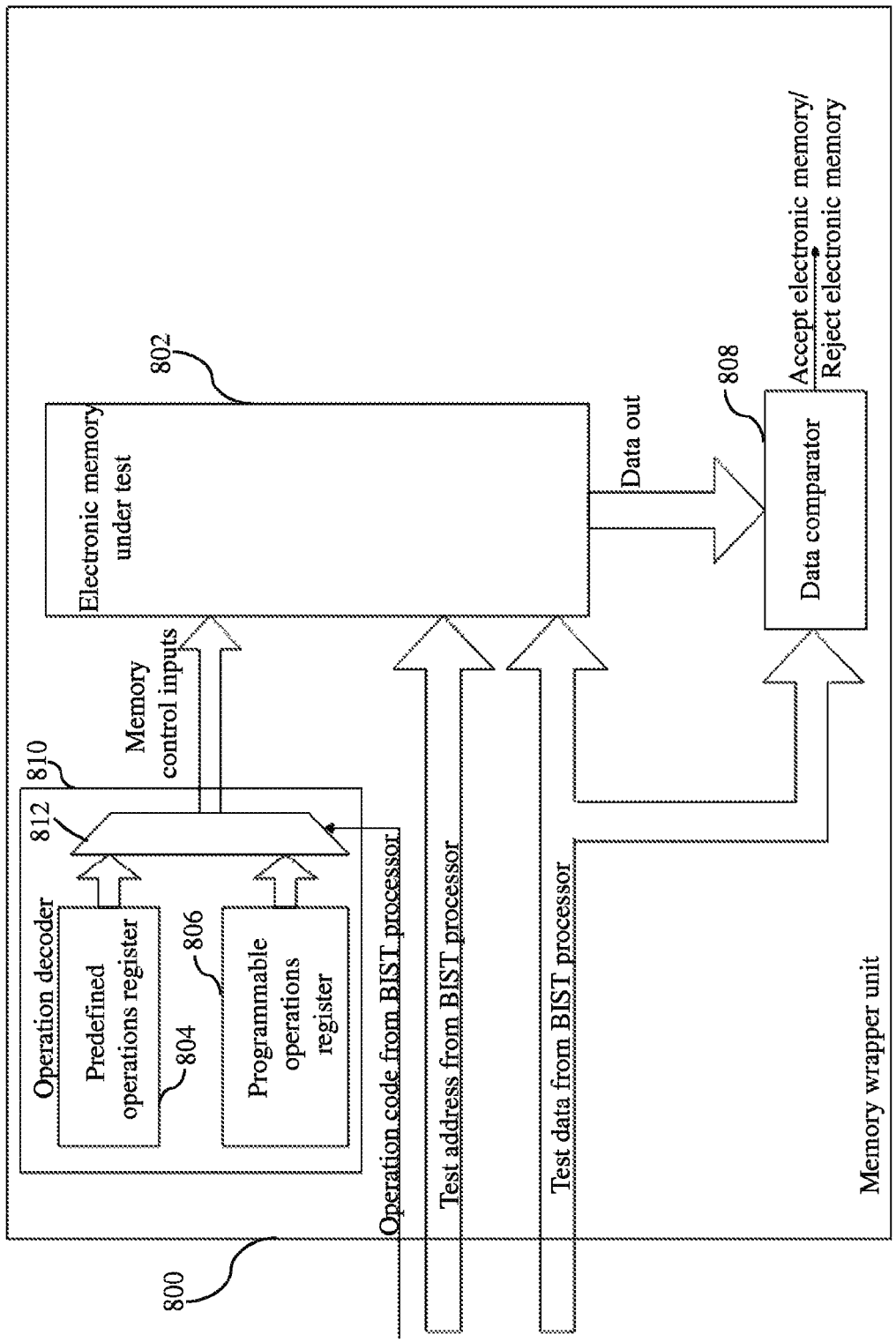
FIG. 8 is a block diagram of a memory wrapper unit, in accordance with one embodiment.
Figure 9:
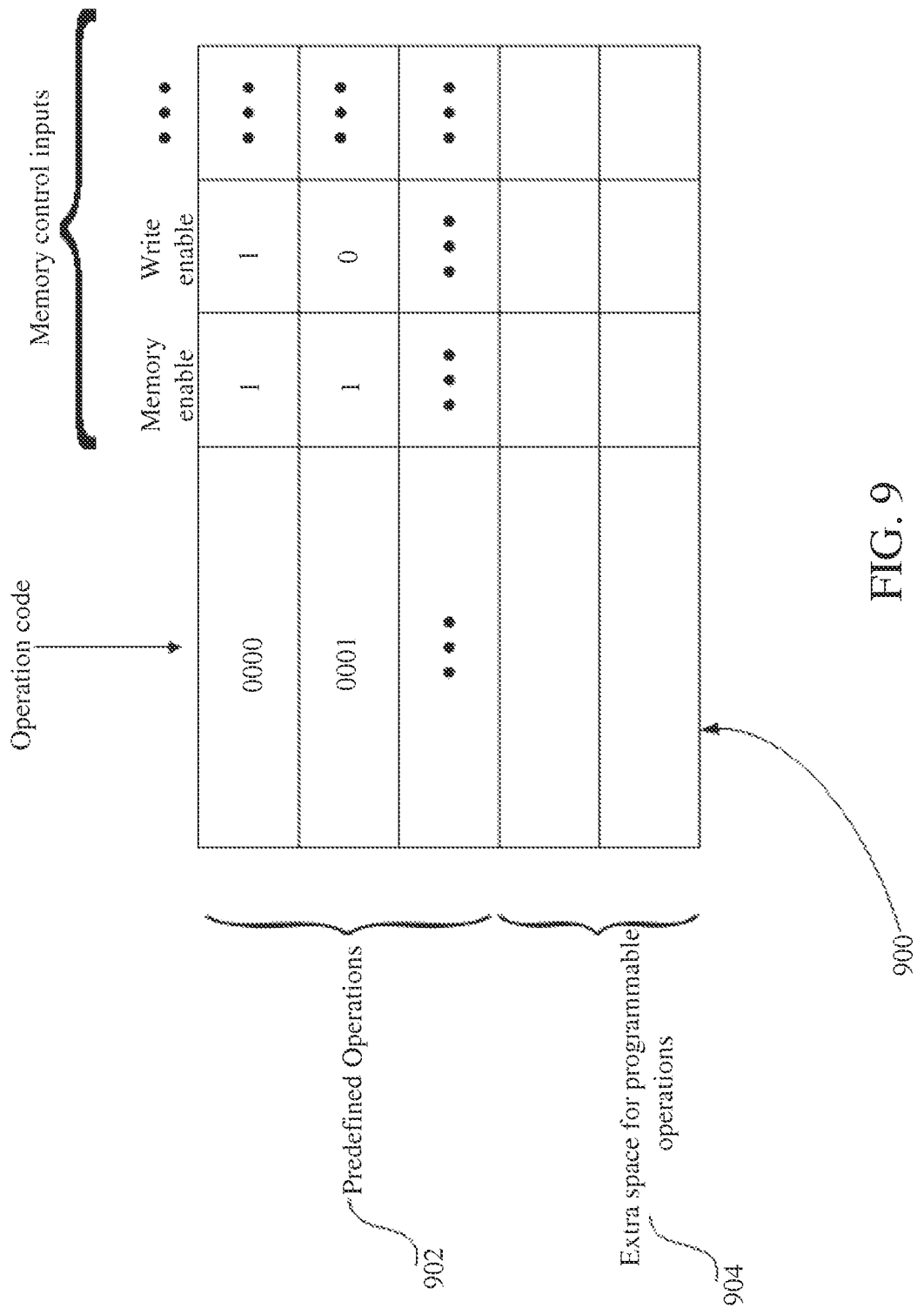
FIG. 9 is an exemplary illustration of functioning of an operation decoder m a memory wrapper unit, in accordance with one embodiment.

FIG. 8 illustrates the memory wrapper unit 800, at the electronic memory under test 802, in accordance with one embodiment. Function of the memory wrapper unit 800 is to accept the operation-code, the memory addresses and the data patterns as generated by the BIST processor unit 500. The memory addresses and the data patterns are further provided to the electronic memory under test 802. The memory wrapper unit 800 includes an operation decoder 810 that serves to interpret the operation code sent by the BIST processor unit 500. The operation decoder 810 further includes a predefined operations register 804 and a programmable operations register 806. The predefined operations register 804 serves to interpret operation codes that have been hard-wired. The programmable operations register 806 allows flexibility of defining new operations that can be needed by newly generated March tests. Such programmable decoding of the operation codes is reflected in a table 900 of FIG. 9, which illustrates mapping between the operations code and actions performed on a memory cell, and which explicitly reserves space for programmable operation codes. The operation code originating from the BIST processor unit 500 serves to select one of the outputs of either the predefined operations register 804 or the programmable operations register 806 via a multiplexer 812. The operation code at output of the multiplexer 812 is used to index into the table 900 illustrated in FIG. 9, and thereby a plurality of memory control inputs (that is, one or more of memory-enable, write-enable, and read-enable) are sent to the electronic memory under test 802. The table 900 also includes predefined operations 902 and extra space for programmable operations 904. The memory wrapper unit 800 also comprises a data comparator 808 which serves to compare the data output from the electronic memory under test 802 with an incoming data pattern from the BIST processor unit 500 so as to accept or reject the electronic memory under test 802. In some embodiments, such a decision is fed back to the BIST processor unit 500 to generate other March tests.

Figure 10:
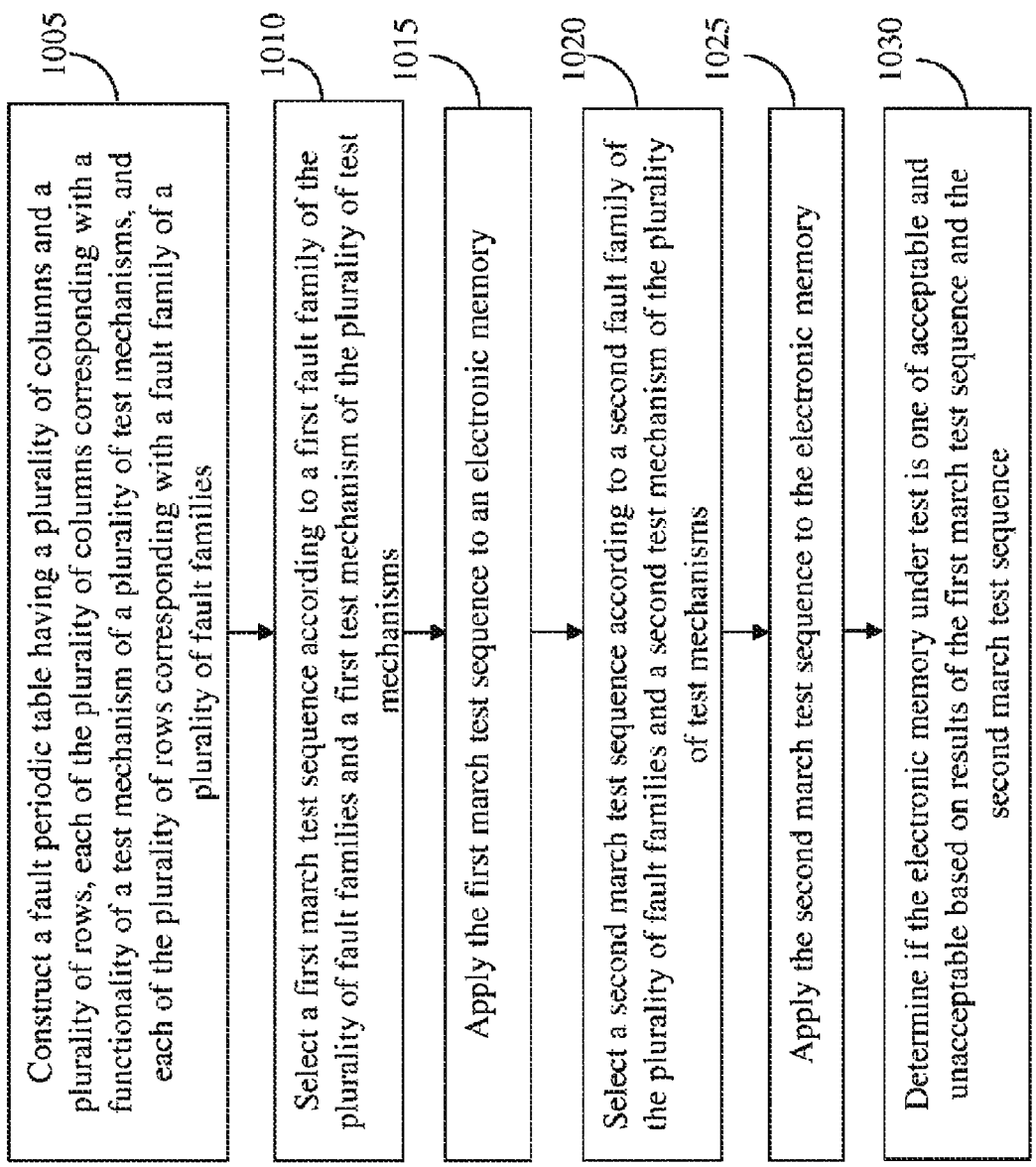
FIG. 10 is a flow diagram illustrating a method of testing an electronic memory, in accordance with one embodiment.

FIG. 10 is a flow diagram illustrating a method of testing an electronic memory, in accordance with one embodiment.

At step 1005, a fault periodic table having a plurality of columns and a plurality of rows is constructed. Each of the columns corresponds with a functionality of a test mechanism of a plurality of test mechanisms, and each of the rows corresponds with a fault family of a plurality of fault families. The test mechanism can include one or more of a background pattern, an addressing mode, an addressing type, and concurrency of operations.

At step 1010, a first March test sequence is selected according to a first fault family and a first test mechanism. The first fault family belongs to the fault families, and the first test mechanism belongs to the test mechanisms.

In some embodiments, selection of the first March test sequence includes selecting test data from a plurality of predefined background patterns and a plurality of programmable background patterns. In other embodiments, selection of the first March test sequence includes selecting a memory control signal from a plurality of predefined operations and a plurality of programmable operations.

At step 1015, the first March test sequence is applied to the electronic memory.

At step 1020, a second March test sequence is selected according to a second fault family of the fault families and a second test mechanism of the test mechanisms.

At step 1025, the second March test sequence is applied to the electronic memory.

The electronic memory is hence tested for each of the fault families as described in steps 1010, 1015, 1020, and 1025.

At step 1030, the electronic memory under test is determined to be one of acceptable and unacceptable based on results of the first March test sequence and the second March test sequence.

In some embodiments, the first March test sequence and the second March test sequence each represent a March test, for example the March test TA, created from a sequence of test operations, for example the sequence of test operations TO, and is explained in conjunction with FIG. 1A, FIG. 1B, and FIG. 1C respectively.

The electronic memory is unacceptable based on failure of one or more of the first March test sequence and the second March test sequence. The electronic memory is hence discarded.

In some embodiments, the results are used to extend the fault periodic table by creating a new fault family or by creating another test mechanism.

It will be clear to one of ordinary skill in the art that the flexibility provided by the present invention in terms of programmability of operation-codes, background patterns, test algorithms, allows customization of the BIST processor unit and also enables a user to find a better and optimal trade-off between functionality and area occupied on silicon. Auto-generalization capability of the present disclosure further can enhance testing of the electronic memory by enabling tests to be conducted efficiently, productively and exhaustively.

The foregoing description sets forth numerous specific details to convey a thorough understanding of embodiments of the disclosure. However, it will be apparent to one skilled in the art that embodiments of the disclosure may be practiced without these specific details. Some well-known features are not described in detail in order to avoid obscuring the disclosure. Other variations and embodiments are possible in light of above teachings, and it is thus intended that the scope of disclosure not be limited by this Detailed Description, but only by the Claims.

What is claimed is:

1. An integrated circuit comprising:
    a memory; and
    a memory test circuit, which when invoked to test the memory, is configured to generate one or more March tests applied to the memory, wherein the memory test circuit is further configured to construct a table including:
        a first index;
        a second index; and
        a first March test of the one or more March tests, wherein each of the one or more March tests comprises a plurality of March elements each including one or more operations, wherein the first index is associated with one or more families each characterized by a different number of the one or more operations of the one or more March tests, wherein the second index is associated with one or more mechanisms each characterized by a different property of the one or more March tests, wherein the property is selected from the group consisting of a background pattern, an addressing mode, an addressing type, and an operation concurrency.

2. The memory test circuit of claim 1, wherein the memory test circuit is further configured to internally generate the one or more March tests from within the integrated circuit.

3. The memory test circuit of claim 1 further configured to generate a second March test from the first March test.

4. The memory test circuit of claim 3, wherein the memory test circuit is further configured to add a first operation to a first March element of the first March test and a second operation to a second March element of the first March test, thereby generating the second March test.

5. The memory test circuit of claim 4, wherein the first operation is symmetric with the second operation and the first element is symmetric with the second element.

6. The memory test circuit of claim 3, wherein the one or more March tests comprises a first March test including a first March element including a first mechanism, wherein the memory test circuit is further configured to change the first mechanism to a second mechanism, thereby generating the second March test.

7. The memory test circuit of claim 6, wherein the first mechanism is the logical opposite of the second mechanism.

8. The memory test circuit of claim 1 further comprising a generation unit configured to generate the one or more March tests to be applied to the electronic memory.

9. The memory test circuit of claim 1, wherein each of the one or more March tests comprises a plurality of March elements, wherein the memory test circuit further comprises:
    a register configured to store one or more March elements of the one or more March tests; and
    a control unit configured to determine the presence of the one or more March elements stored in the register.

10. The memory test circuit of claim 1 further comprising:
    a finite state machine configured to coordinate a plurality of functions of the memory test circuit;
    an address generator coupled to the finite state machine and configured to generate addresses of memory cells of the memory for testing; and
    a data generator coupled to the finite state machine and configured to generate data patterns to be applied to the electronic memory.

11. A method for testing a memory in an integrated circuit, the method comprising generating, using a memory test circuit in the integrated circuit, one or more March tests applied to the memory, when the memory test circuit is invoked to test the memory, wherein the method further includes constructing a table including:
    a first index;
    a second index; and
    a first March test of the one or more March tests, wherein each of the one or more March tests comprises a plurality of March elements each including one or more operations, wherein the first index is associated with one or more families each characterized by a different number of the one or more operations of the one or more March tests, wherein the second index is associated with one or more mechanisms each characterized by a different property of the one or more March tests, wherein the property is selected from the group consisting of a background pattern, an addressing mode, an addressing type, and an operation concurrency.

12. The method of claim 11, wherein the memory test circuit internally generates the one or more March tests from within the integrated circuit.

13. The method of claim 11 further comprising generating a second March test from the first March test.

14. The method of claim 13, wherein the method further comprises adding a first operation to a first March element of the first March test and a second operation to a second March element of the first March test, thereby generating the second March test.

15. The method of claim 14, wherein the first operation is symmetric with the second operation and the first element is symmetric with the second element.

16. The method of claim 13, wherein the one or more March tests comprises a first March test including a first March element including a first mechanism, wherein the method further comprises changing the first mechanism to a second mechanism, thereby generating the second March test.

17. The method of claim 16, wherein the first mechanism is the logical opposite of the second mechanism.

18. The method of claim 11 further comprising generating, using a generation unit, the one or more March tests to be applied to the electronic memory.

19. The method of claim 11, wherein each of the one or more March tests comprises a plurality of March elements, wherein the method further comprises:
    storing, using a register, one or more March elements of the one or more March tests; and
    determining, using a control unit, the presence of the one or more March elements stored in the register.

20. The method of claim 11 further comprising:
    coordinating, using a finite state machine, a plurality of functions of the memory test circuit;
    generating, using an address generator coupled to the finite state machine, addresses of memory cells of the memory for testing; and
    generating, using a data generator coupled to the finite state machine, data patterns to be applied to the electronic memory.

21. An apparatus comprising:
    a memory; and
    a memory test circuit, which when invoked to test the memory, is configured to generate one or more March tests applied to the memory;
    construct a table comprising:
    a first index;
    a second index; and
    a first March test of the one or more March tests, wherein each of the one or more March tests comprises a plurality of March elements each including one or more operations, wherein the first index is associated with one or more families each characterized by a different number of the one or more operations of the one or more March tests, wherein the second index is associated with one or more mechanisms each characterized by a different property of the one or more March tests, wherein the property is selected from the group consisting of a background pattern, an addressing mode, an addressing type, and an operation concurrency;
    generate a second March test from the first March test, wherein each of the one or more March tests comprises a plurality of March elements each including one or more operations, wherein the memory test circuit is further configured to add a first operation to a first March element of the first March test and a second operation to a second March element of the first March test, thereby generating the second March test.

* * * * *